(12) United States Patent
Heid

(10) Patent No.: US 6,369,569 B1
(45) Date of Patent: Apr. 9, 2002

(54) MAGNETIC RESONANCE TOMOGRAPHY APPARATUS AND OPERATING METHOD FOR DISPLAYING TISSUE CONTRASTS WITH A SHORT MEASURING TIME

(75) Inventor: Oliver Heid, Gunzenhausen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/487,279

(22) Filed: Jan. 19, 2000

(30) Foreign Application Priority Data

Jan. 26, 1999 (DE) .......................... 199 03 029

(51) Int. Cl.$^7$ ................................ G01V 3/00
(52) U.S. Cl. ................ 324/309; 324/318; 324/307
(58) Field of Search ................ 324/309, 307, 324/310, 318

(56) References Cited

U.S. PATENT DOCUMENTS

| 4,707,658 A | 11/1987 | Frahm et al. ............ 324/309 |
| 4,982,161 A | * 1/1991 | Twieg ................... 324/309 |
| 5,541,514 A | 7/1996 | Heid et al. .............. 324/309 |

* cited by examiner

*Primary Examiner*—Jay Patidar
*Assistant Examiner*—Brij B. Shrivastav
(74) *Attorney, Agent, or Firm*—Schiff Hardin & Waite

(57) ABSTRACT

In a magnetic resonance imaging method and apparatus, a measuring cycle of successive pulse sequences with an RF excitation pulse and magnetic field gradient pulses for rephasing the nuclear magnetization of an examination subject is generated, and the measuring cycle is interrupted after a defined number of repetitions of the successive pulse sequences before reaching a dynamic steady state, and is restarted later.

7 Claims, 2 Drawing Sheets

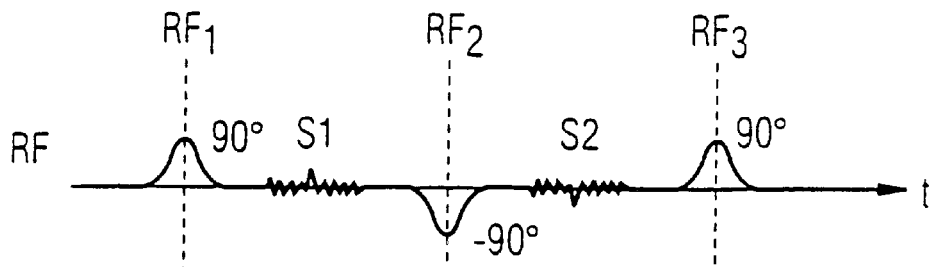
FIG 1A
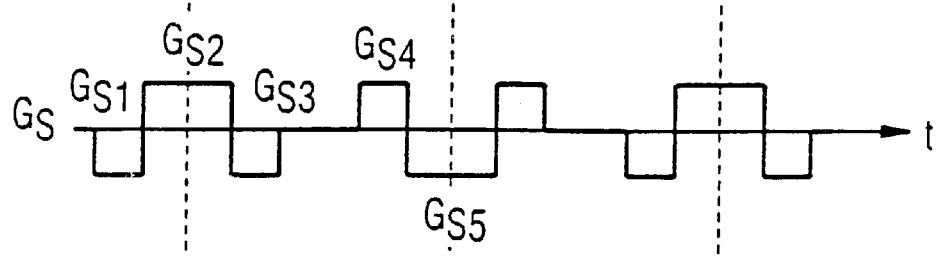
FIG 1B
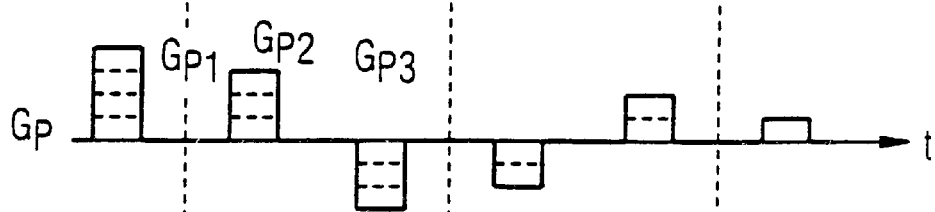
FIG 1C
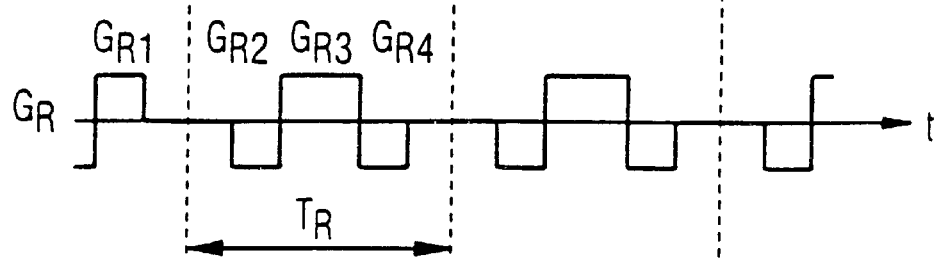
FIG 1D
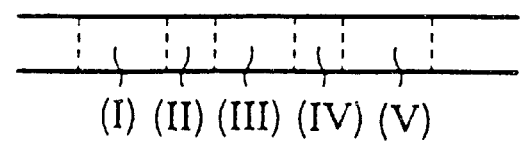

MAGNETIC RESONANCE TOMOGRAPHY APPARATUS AND OPERATING METHOD FOR DISPLAYING TISSUE CONTRASTS WITH A SHORT MEASURING TIME

BACKGROUND OF THE INVENTION

1. Field of the Invention

The present invention is directed to a magnetic resonance tomography apparatus as well as to a method for operating a magnetic resonance tomography apparatus.

2. Description of the Prior Art

By means of a radio-frequency field in the megahertz range and a spatially variable magnetic constant field, magnetic resonance tomography utilizes the sharp resonance absorption of magnetic nuclei in biological tissue in order to spatially allocate the nuclear magnetization and display an image of the biological tissue, for example of a human. Due to the spatially variable magnetic constant field, known as the gradient field, the nuclear spin resonant frequency or Larmor frequency of the respective nuclei, particularly hydrogen nuclei, varies spatially. The excited spatial volume of the specimen is thus frequency-coded. The image generation then ensues with a computer on the basis of a Fourier transformation of the raw data which are thus obtained.

A short measuring time is required for avoiding motion artifacts for many applications wherein a movement on the part of the patient is unavoidable, for example in the abdominal or chest region of a patient. Moreover, short examination durations increase the acceptance of magnetic resonance tomography by the patient as well as, due to a higher patient throughput, the economic feasibility of the method. Magnetic resonance methods therefore have been developed with a short measuring time, for example the FISP method, this acronym standing for Fast Imaging with Steady Precession. A pulse sequence composed of an RF excitation pulse and magnetic field gradient pulses in three spatial directions with a repetition time $T_R$ is thereby generated that is significantly shorter than the relaxation time $T_1$ and $T_2$ of the nuclear magnetizations of the examination subject. After a transient response whose duration lies on the order of magnitude of the longitudinal relaxation $T_1$ or the transverse relaxation $T_2$, a driven steady state is achieved wherein the nuclear magnetization angle oscillates between two values $\pm\alpha$. An example of such a FISP pulse sequence is disclosed in German PS 44 27 497.

A similar method is described in German PS 35 04 734, which discloses a method and an apparatus for the implementation of the method for the registration of spin resonance data for a spatially resolved examination of a subject that contains nuclear spins and is arranged in a constant, uniform magnetic field that aligns the spins in the field direction. Pulse sequences composed of an RF excitation pulse and a magnetic field gradient pulse are thereby employed. The Rf excitation pulse has a flip angle of significantly less than 90°, so that only a fraction of the spins aligned by the constant magnetic field are flipped, these, however, being sufficient for generating an echo due to the magnetic field gradient pulse. A steady state already occurs after a few sequences as a result of the $T_1$ relaxation. The sequences are thereby repeated at short intervals, so that extremely short repetition times are achieved. Due to the dynamic steady state, the described method is particularly suited for unlimited, continuous imaging.

Given the above-described methods, the short pulse repetition time enables a fast data acquisition, and thus short measuring times. The disadvantage of these methods, however, is that, in the steady state, the magnetization signal is only dependent on the ratio $T_1/T_2$ according to the equation $$M = M_o \frac{\sin\alpha}{1 + T_1/T_2 + (1 - T_1/T_2)\cos\alpha}$$

(see H. Morneburg, "Bildgebende Systeme für die medizinische Diagnostik", Erlangen 1995, p. 560). With the exception of liquids like blood, gall or liquor in the tissue, however, the quotient $T_1/T_2$ is usually relatively constant, so that a good, clinically significant contrast cannot be displayed.

SUMMARY OF THE INVENTION

It is an object of the present invention to provide a magnetic resonance imaging method that enables the display of physiologically significant tissue contrasts while still having an optimally short measuring time at the same time.

This object is achieved in a magnetic resonance imaging method wherein successive pulse sequences with an RF excitation pulse and magnetic field gradient pulses are repeated for complete rephasing of the nuclear magnetization, with the pulse generation being interrupted after a measuring cycle containing a defined number of successive pulse sequences before a driven steady state of the nuclear magnetizations is reached and is restarted later. The magnetic resonance signal acquired during the transient time produces a better tissue contrast than a signal acquired in the steady state. Because the measurement is stopped (interrupted) before the steady state is reached and is then restarted, the advantages of a short measuring time can nonetheless be realized.

A pause for relaxation of the nuclear magnetizations can be provided in the thermal equilibrium state. A preparation pulse sequence for preparation of the examination subject can be provided before the beginning of a measurement cycle dependent on the field of application. Preparation methods such as a fat saturation method, an inversion recovery method, a saturation pulse method, a driven equilibrium Fourier transform method or a diffusion pulse method can be used.

For further shortening of the measuring time, measurements in other slice sections can be implemented during a measuring pause in one slice section of the examination subject.

In the inventive method, three through ten pulse sequences are preferably emitted in succession, a measuring pause then ensuing.

The invention is also directed to a nuclear magnetic resonance tomography apparatus with an RF stage for generating RF pulses and a magnet system for generating a constant magnetic field and a gradient magnetic field superimposed thereon, whereby the RF stage and the magnet system being fashioned for generating pulse sequences according to the inventive method described above.

DESCRIPTION OF THE DRAWINGS

FIGS. 1A through 1D show an exemplary pulse sequence of the invention.

DESCRIPTION OF THE PREFERRED EMBODIMENTS

Figure 2:
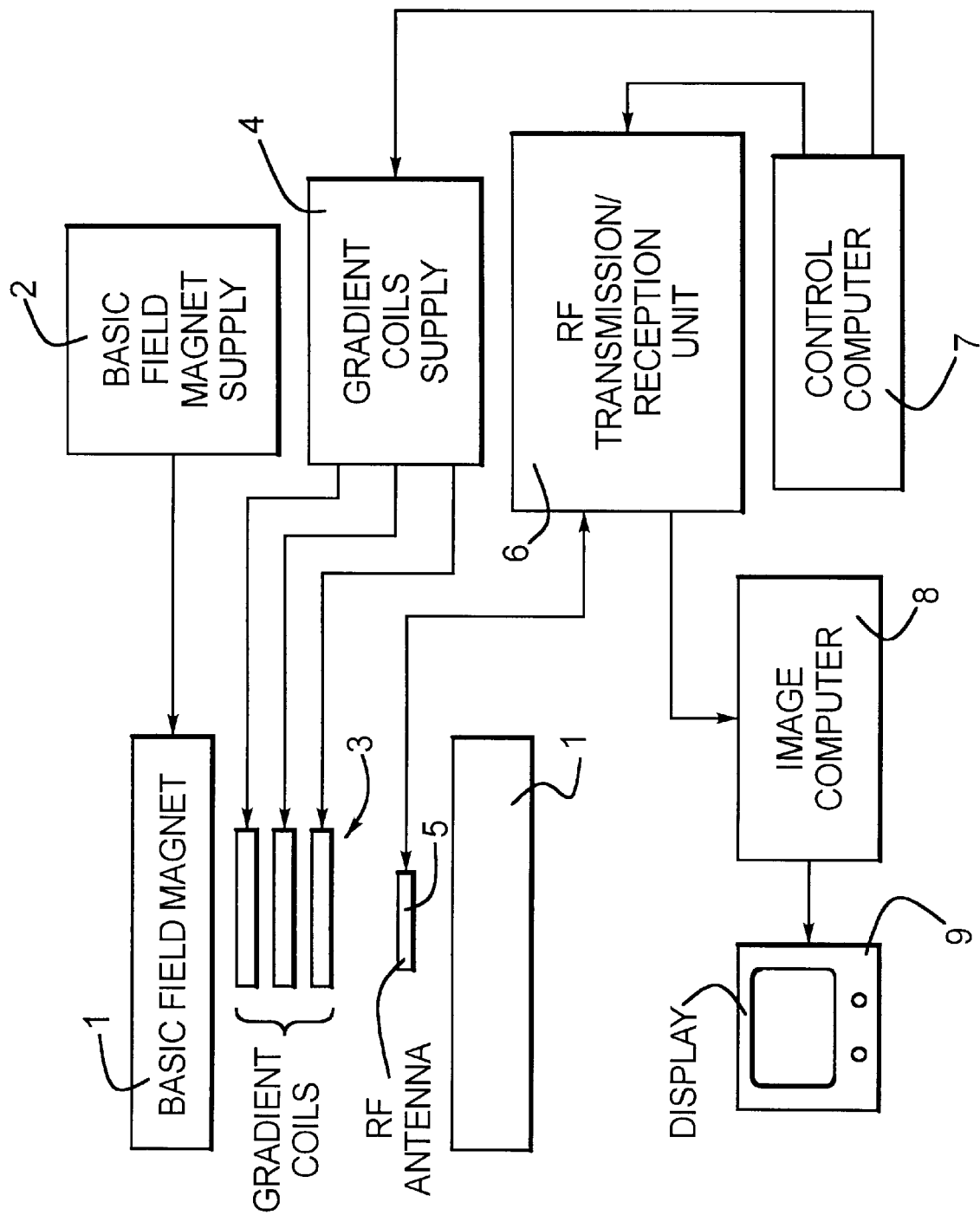
FIG. 2 is a schematic block diagram of a magnetic resonance imaging apparatus constructed and operating in accordance with the principles of the present invention.

FIG. 1A shows the radio-frequency pulse RF in the time sequence, which produces a flip angle of 90° in the exemplary embodiment. Those skilled in the art, however, can select a different flip angle dependent on the desired field of application. FIGS. 1B through 1D show magnetic field gradient pulses in three spatial directions oriented perpendicularly relative to one another. FIG. 1B thereby shows the gradient pulses $G_S$ in the slice direction of the examination subject, FIG. 1C shows the gradient pulses in a direction (phase direction) perpendicular thereto, and FIG. 1D shows the gradient pulses $G_R$ in the readout direction.

Each sequence having a repetition period $T_R$ begins with a frequency-selective radio-frequency pulse $RF_1$ that is emitted with a slice selection gradient pulse $G_{S2}$, so that only one selected slice of the examination subject is excited. In a time segment II following thereupon, a dephasing of the nuclear magnetization ensues in the readout direction due to a gradient pulse $G_{RZ}$. In the time segment II, further, a phase coding gradient pulse $G_{P2}$ as well as a gradient pulse $G_{S3}$ directed opposite the slice selection gradient pulse $G_{S2}$ are activated. As a result thereof, the dephasing caused by the slice selection gradient pulse $G_{S2}$ is in turn cancelled.

A readout gradient pulse $G_{R3}$ is activated in the following time segment III, and thus a rephasing of the nuclear spins is achieved, so that a nuclear magnetic resonance signal S1 arises. This nuclear magnetic resonance signal S1 is sampled and employed in a conventional way for producing an image.

In a time segment IV, a slice selection gradient $G_{S4}$ in the positive slice selection direction, a gradient pulse $G_{P3}$ opposite the gradient pulse $G_{P2}$ and a gradient pulse $G_{R4}$ in the negative readout direction are activated.

In a time segment V, finally, corresponding to the segment I of the next, following pulse sequence, a radio-frequency pulse RF2 with a flip angle of, for example, −90° is activated under a slice selection gradient pulse $G_{S5}$ in the negative slice selection direction. A new readout interval is thus initiated.

The pulse sequence is repeated n times, for example 3 through 10 times, with different values of the phase coding gradient pulses $G_{P2}$. The phase position of the radio-frequency excitation pulses is inverted from pulse sequence-to-pulse sequence, so that the operational signs of the flip angles effected by the excitation pulses RF alternate. All gradient pulses are applied such that their time integral overeat repetition time $T_R$ yields zero. The number of repetitions is limited such that the system is always in the transient phase wherein a high T1 contrast can be made visible. The pulse sequence is thus inventively aborted before the steady state is reached, the FISP sequences having been originally conceived therefor. A good T1 contrast can be united with a short evaluation time in this way.

Of course, the invention is not limited to the pulse sequence shown in FIG. 1. Those skilled in the art can select a suitable combination of RF pulses with gradient pulses in all three spatial directions. Dependent on the field of application or the desired or suppressed tissue contrast, a suitable excitation pulse can also precede the sequence of successive pulse sequences of a measuring cycle.

A measurement cycle composed of a number of n successive pulse sequences is inventively aborted before the steady state is reached, so that the nuclear magnetizations (vectors) can again relax into their thermal equilibrium state. Given slice-specific pulses as in the exemplary embodiment shown in FIGS. 1A through 1D, measuring cycles of other slices can be emitted in the meantime in order to save measuring time.

As shown in FIG. 2, a magnetic resonance apparatus for implementing the pulse sequence shown in FIGS. 1A through 1D as a basic field magnet 1 supplied by a basic field magnet supply 2. The system has gradient coils 3 for respectively emitting the gradient magnetic fields $G_S$, $G_P$ and $G_R$, operated by a gradient coil supply 4. An RF antenna 5 is provided for generating the RF pulses, and for receiving the resulting magnetic resonance signals. The RF antenna 5 is operated by an RF transmission/reception unit 6. The gradient coil supply and the RF transmission/reception unit 6 are operated by a control computer 7 to produce the pulses respectively shown in FIGS. 1A through 1D. The received magnetic resonance signals are supplied to an image computer 8, which generates a magnetic resonance image therefrom, which is shown on a display 9.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for operating a magnetic resonance tomography apparatus comprising the steps of:
    subjecting an examination subject to a plurality of pulse sequences each containing an RF excitation pulse and magnetic field gradient pulses for completely rephasing nuclear magnetization within said examination subject produced by said RF excitation pulse; and
    interrupting generation of said pulse sequences after a measuring cycle comprising a predetermined number of repetitions of said pulse sequences before a driven steady state is reached in said examination subject, and subsequently restarting generation of said pulse sequences.

2. A method as claimed in claim 1 comprising providing pauses between successive measuring cycles for allowing relaxation of nuclei producing said nuclear magnetization into a thermal equilibrium state.

3. A method as claimed in claim 1 comprising, before each measuring cycle emitting a preparation pulse sequence for preparing said examination subject for a subsequent measuring cycle.

4. A method as claimed in claim 3 wherein said preparation method is a method selected from the group consisting of a fat saturation method, an inverse recovery method, a saturation pulse method, a driven equilibrium Fourier transform method, and a diffusion pulse method.

5. A method as claimed in claim 1 wherein said plurality of pulse sequences are generated for obtaining data from said examination subject in a first slice of said examination subject, and comprising the additional step of obtaining data from a second, different slice of said examination subject during interruption of said plurality of pulse sequences.

6. A method as claimed in claim 1 comprising generating a plurality of said pulse sequences in a range between three pulse sequences and ten pulse sequences in each measuring cycle.

7. A magnetic resonance tomography apparatus comprising:
    a scanner including an RF coil and a gradient coil system adapted to receive an examination subject therein;
    a controller connected to said RF coil and to said gradient system for operating said RF coil and gradient coil system to subject said examination subject to a plurality of pulse sequences each containing an RF excitation pulse emitted by said RF coil and magnetic field gradient pulses emitted by said gradient coil system for completely rephasing nuclear magnetization within said examination subject produced by said RF excitation pulse; and said controller interrupting generation of said pulse sequences after a measuring cycle comprising a predetermined number of repetitions of said pulse sequences before a driven steady state is reached in said examination subject, and subsequently restarting generation of said pulse sequences.

* * * * *